United States Patent
Chen et al.

(10) Patent No.: US 9,144,183 B2
(45) Date of Patent: Sep. 22, 2015

(54) EMI COMPARTMENT SHIELDING STRUCTURE AND FABRICATING METHOD THEREOF

(71) Applicant: UNIVERSAL SCIENTIFIC INDUSTRIAL ( SHANGHAI ) CO., LTD., Shanghai (CN)

(72) Inventors: Jen-Chun Chen, Nantou County (TW); Xiao-Wen Cao, Shanghai (CN); He-Yi Chang, Nantou County (TW)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 268 days.

(21) Appl. No.: 13/955,111

(22) Filed: Jul. 31, 2013

(65) Prior Publication Data

US 2015/0036296 A1  Feb. 5, 2015

(51) Int. Cl.
*H05K 7/00* (2006.01)
*H05K 3/10* (2006.01)
(Continued)

(52) U.S. Cl.
CPC ............... *H05K 9/0007* (2013.01); *H01L 21/50* (2013.01); *H01L 21/56* (2013.01); *H01L 23/552* (2013.01);
(Continued)

(58) Field of Classification Search
CPC ....... H01L 23/48; H01L 23/552; H01L 21/56; H01L 21/50; H01L 31/0203; H01L 31/18; H05K 9/00; H05K 9/0007; H05K 3/10; H05K 13/00
USPC ......... 361/728, 818, 729, 730, 736, 748, 752, 361/753, 760, 767, 816; 29/846; 257/428; 438/28, 66
See application file for complete search history.

(56) References Cited

U.S. PATENT DOCUMENTS

| 5,991,155 A | * | 11/1999 | Kobayashi et al. ........... 361/705 |
| 2009/0000815 A1 | * | 1/2009 | Hiner et al. .................... 174/350 |

(Continued)

FOREIGN PATENT DOCUMENTS

JP    2012-256842 A    12/2012

OTHER PUBLICATIONS

Official Action on Japanese Patent Application No. 2013-211040 dated May 25, 2015, 2 pages. (No English translation available).
Germany Patent Office, Search Report issued on Mar. 7, 2014.

*Primary Examiner* — Courtney Smith
*Assistant Examiner* — Zhengfu Feng
(74) *Attorney, Agent, or Firm* — Foley & Lardner LLP; Cliff Z. Liu; Angela D. Murch

(57) ABSTRACT

A package-integrated EMI compartment shielding structure includes an encapsulating member disposed on a mounting surface of a substrate. The substrate has a ground pad exposedly arranged thereon. The encapsulating member, who defines a peripheral surface, covers the ground pad and encapsulates at least one electronic element. A compartment structure is disposed in the encapsulating member, electrically connecting the ground pad and substantially dividing the encapsulating member into at least two package compartments. The terminal portions of the compartment structure are arranged within the encapsulating member proximal to yet without compromising the peripheral surface. A notch is disposed into the encapsulating member from the peripheral surface corresponding to the location of the terminal portions of the compartment structure to expose the lateral surface thereof across the thickness of the encapsulating member. A conformal shield is disposed on the encapsulating member, electrically connecting the compartment structure through the notch.

14 Claims, 7 Drawing Sheets

(51) Int. Cl.
*H01L 27/14* (2006.01)
*H01L 21/00* (2006.01)
*H05K 9/00* (2006.01)
*H01L 21/56* (2006.01)
*H01L 31/0203* (2014.01)
*H01L 23/552* (2006.01)
*H01L 21/50* (2006.01)
*H05K 13/00* (2006.01)
*H01L 23/48* (2006.01)
*H01L 31/18* (2006.01)
*H01K 3/10* (2006.01)

(52) U.S. Cl.
CPC .............. *H01L 31/0203* (2013.01); *H05K 9/00* (2013.01); *H01K 3/10* (2013.01); *H01L 23/48* (2013.01); *H01L 31/18* (2013.01); *H05K 13/00* (2013.01)

(56) References Cited

U.S. PATENT DOCUMENTS

| | | | |
|---|---|---|---|
| 2009/0109537 A1 | 4/2009 | Bright et al. | |
| 2009/0194852 A1* | 8/2009 | Chiu et al. | 257/660 |
| 2012/0235259 A1* | 9/2012 | Fang et al. | 257/428 |
| 2012/0286415 A1* | 11/2012 | Sakai et al. | 257/734 |

* cited by examiner

EMI COMPARTMENT SHIELDING STRUCTURE AND FABRICATING METHOD THEREOF

FIELD OF THE INVENTION

The instant disclosure relates to electromagnetic interference (EMI) shielding structure, and more specifically, to EMI compartment shielding structure suitable for small form factor electronic packaging and fabrication method thereof.

BACKGROUND

As modern electronic devices are geared for ever-increasing speed and performance, the operating frequency of the electronic components hikes considerably in comparison to the devices in the past. Higher operating frequency usually means the generation of stronger electromagnetic (EM) emission. On the other hand, as the desire for device miniaturization becomes a non-stoppable trend, the shrinking physical dimensions of modern electronic devices means that potential crosstalk/interference caused by EM emissions from close neighboring components will become inevitable.

Conventional measures against EMI/crosstalk often involve the provision of metal shielding cases having compartment walls arranged therein, and are often disposed over an electronic package through adhesive. The physical dimension of a separately constructed shielding structure may be too big and heavy for today's miniature electronic devices. Moreover, such conventional arrangement generally lacks structural coherency, and the shielding case is prone to detachment from the package. Other known EMI preventing measures often involve EMI shielding structures whose fabrication require extensive use of expensive equipment.

Accordingly, it is desirable to provide an EMI compartment structure that is capable of not only offering reliable shielding performance but also being fabricated through cost-effective methods.

SUMMARY

One aspect of the instant disclosure provides an electronic package module having integrated electromagnetic interference (EMI) compartment shielding structure that is capable of providing thorough electromagnetic isolation between compartments, and is capable of being fabricated through cost-effective methods such as spray plating process.

Another aspect of the instant disclosure provides a method for fabricating an integrated EMI compartment shielding structure in an electronic package through reliable and cost-effective techniques. The fabricating method is suitable for adaptation in a wide range of applications, particularly in small form factor devices. For one thing, the method is suitable for providing structurally secure and functionally reliable EMI compartment shielding in electronic packages ranging from single chip device to a sub-portion of a complex integrated package structure.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. the invention itself, however, as well as a preferred mode of use, further objectives and advantages thereof, will best be understood by reference to the following detailed description of an illustrative embodiments when read in conjunction with the accompanying drawings, wherein:

DETAILED DESCRIPTION

Embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail so as to avoid unnecessarily obscuring the relevant description of the various embodiments. It is to be noted that the following descriptions of preferred embodiments are provided herein for purpose of illustration and description. It is not intended to be exhaustive or limiting to the precise form disclosed.

Figure 1A:
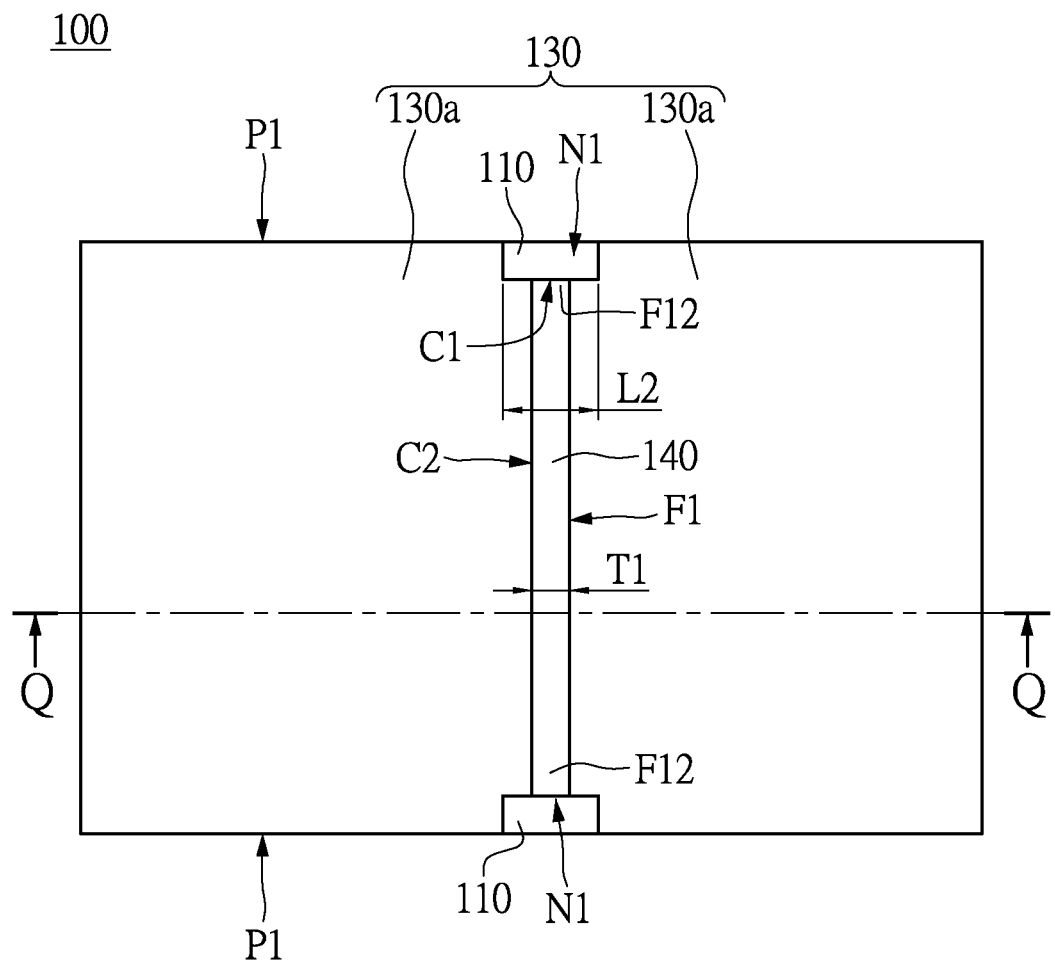
FIG. 1A shows a plan view of an electronic package utilizing an EMI compartment shielding structure in accordance with the instant disclosure.
Figure 1B:
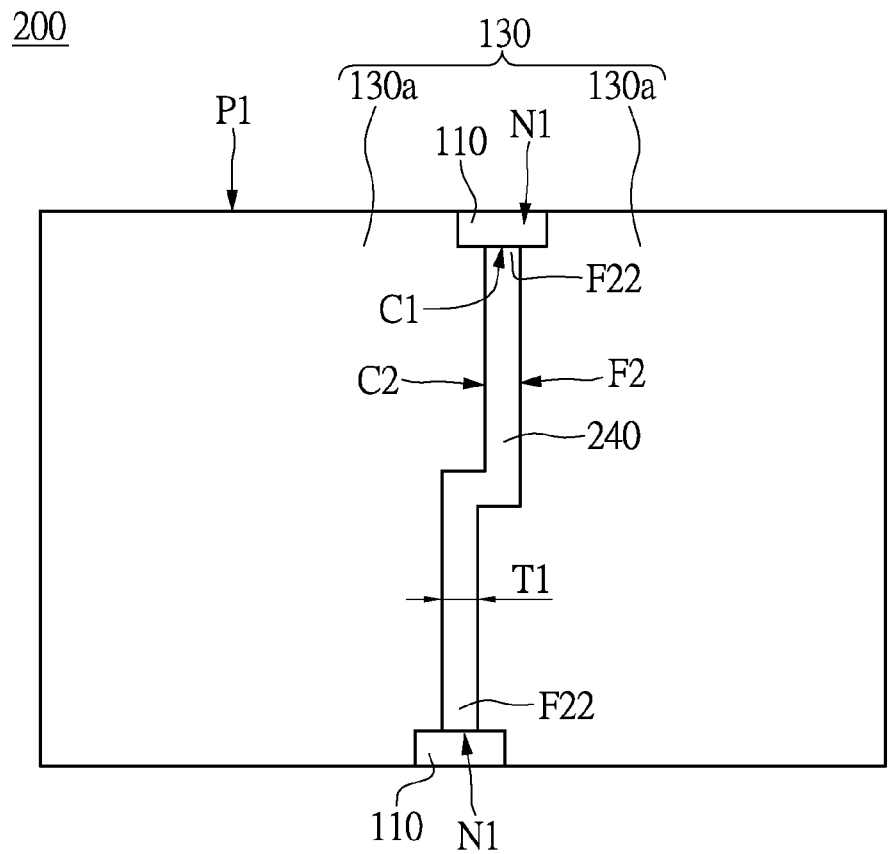
FIG. 1B shows a plan view of an electronic package utilizing an EMI compartment shielding structure that comprises bending segments, in accordance with the instant disclosure.
Figure 1C:
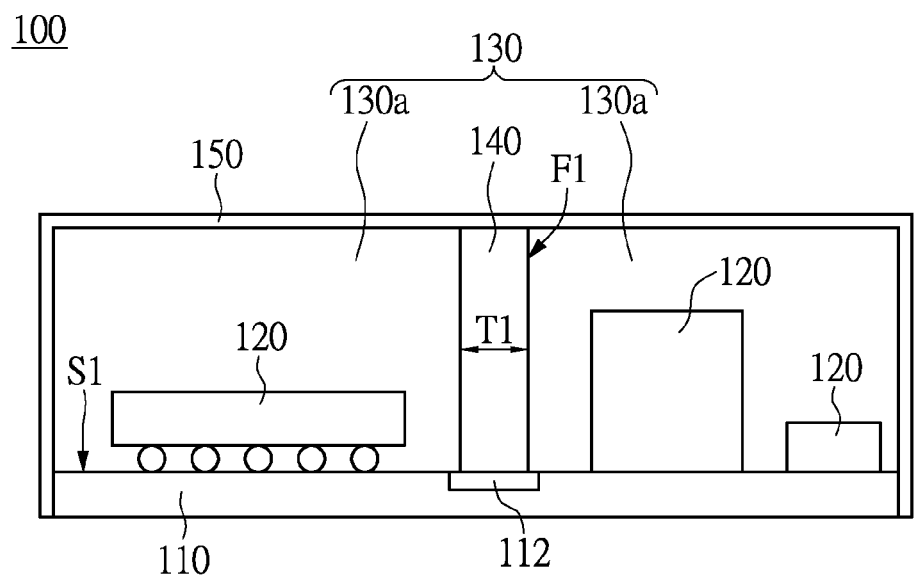
FIG. 1C shows a cross-sectional view of the electronic package along the line Q-Q as shown in FIG. 1A.

Please refer concurrently to FIGS. 1A and 1C, which respectively show a plan view of an electronic package module utilizing an integrated electromagnetic interference (EMI) shielding structure in accordance with the instant disclosure and a cross-sectional view thereof along the line Q-Q. The electronic package module (100) in this exemplary embodiment comprises a substrate (110), at least one electronic element (120), an encapsulating member (130), a compartment structure (140), and a conformal shielding structure (150). Electronic elements (120) that are to be protected/shielded are disposed on the mounting surface of the substrate (110). The encapsulating member (130) is disposed on the substrate (110), at least partially covering the mounting surface (S1) thereof, to encapsulate the electronic elements (120) to be shielded. The encapsulating member (130) is divided into at least two isolated package compartments (130a) by the compartment structure (140) arranged there-between, with at least one of the compartment (130a) containing at least one electronic element (120). The conformal shield (150) is disposed on the encapsulating member (130), selectively covering the exposed surface thereof.

The substrate (110) includes an electronic element mounting surface (S1). The substrate (110) further comprises a ground pad (112) exposely arranged on the mounting surface (S1) thereof. In general, the substrate (110) comprises the necessary circuit traces and bonding pads (not shown in the figures), and servers as a carrier that provides structural support and electrical connection for mounting a variety of electronic components. In practice, the arrangement of the ground pad (112), bonding pad (not shown), and circuit traces (not shown) may depend on the specific operational requirements or other design factors suitable for the particular type of electronic element (120) to be mounted.

Figure 2:
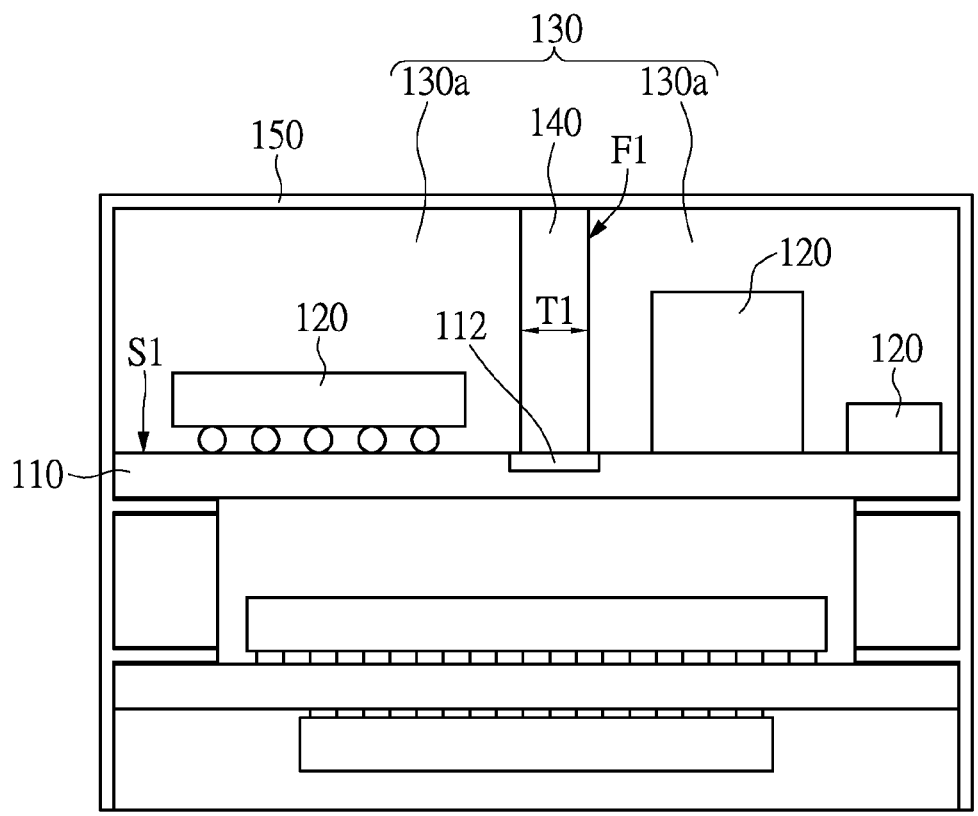
FIG. 2 illustrates a cross-sectional view of an integrated electronic package having a selective portion thereof utilizing an EMI compartment shielding structure in accordance with the instant disclosure.

One common form of substrate (110) is printed circuit board (PCB), which is usually made of suitable materials including epoxy resin, cyanate ester core (CE core), bismaleimide core (BMI core), etc. However, the substrate referred herein is not limited only to PCBs as in a traditional sense, and may vary in shape, form, structural arrangement, and material. For one thing, any carrier structure that defines a mounting surface and comprises the necessary circuit traces and bonding pads, which can provide structural support and electrical connection for mounting electronic components, may be referred to as a substrate. For example, in some integrated packages, a substrate may be defined by the exposed surface of a molding/encapsulating module, which in turn serves as a mounting surface for another molded electronic package module, as illustrated by the cross-sectional view of an exemplary package in FIG. 2.

Electronic elements (120), particularly the ones to be shielded, are disposed on the mounting surface (S1) of the substrate (110) and establish electrical connection there-with through suitable surface mounting techniques (SMT). In many applications, electronic components/elements that operate at high frequency and generate high degree of EMI noise, and/or the ones that are sensitive to electromagnetic interference (such as sensor components), are desired to be shielded/protected. The electronic elements (120) may include components such as integrated circuits (IC) that operate in radio-frequency bands (e.g. transceiver ICs, memory circuits, and other ICs that produce electromagnetic signals with fundamentals/harmonics in radio frequency bands) and circuitry formed from one or more discrete active/passive component such as electronic chips, transistors, diodes, inductors, capacitors, resistors, and switches, etc. The number, type, and arrangement of the electronic elements (120) shall depend on particular functional requirement and specific operational needs, and should not be limited to the pictorial illustration provided for the instant exemplary embodiment.

The encapsulating member (130) is disposed on the substrate (110), at least partially covering the mounting surface (S1) thereof, to encapsulate the electronic elements (120) to be protected. The encapsulating member (130) defines at least one peripheral/lateral surface (P1). In the instant exemplary embodiment, the encapsulating member (130) resumes substantially the form of a flat rectangular prism, which has a top surface and four continuous yet discrete peripheral sides. However, the shape of the encapsulating member need not be limited to the illustration provided by the instant example, but should depend on particular functional requirement and specific operational needs. For instance, in some applications, the encapsulating member may be a substantially cylindrical structure; in other applications, it may even take the form of a hemisphere. A confined trench (F1) is disposed in the encapsulating member (130), substantially dividing the encapsulating member into at least two regions (when viewed from above), thereby defining at least two package compartments (130a) therein. Specifically, the trench (F1) is penetratively formed from the top surface of the encapsulating member to the bottom surface thereof, and is correspondingly patterned/positioned to at least partially reveal/expose the ground pad (112) on the mounting surface (S1) of the substrate (110). Moreover, the trench (F1) is patterned within the encapsulating member (in an overhead view, as shown in FIG. 1A), with the end portions (F12) thereof confined within the boundary defined by the peripheral surface (P1), i.e., without compromising the peripheral surface (P1) of the encapsulating member (130). It should be noted that, although the instant exemplary embodiment adapts a substantially straight-cut trench pattern (F1) that is formed substantially perpendicular to the mounting surface (S1) with a substantially uniform width (T1) (as shown in the cross-sectional view of FIG. 1C), in other applications, the overhead trench pattern, the penetrating angle, and the cross-sectional shape thereof may vary according to specific functional considerations or to accommodate different manufacturing requirements. For example, in some embodiments, the trench pattern may comprise segments and bends, (as shown by FIG. 1B); in some cases it can even comprise serrated and/or curvilinear segments. Likewise, the cross-sectional shape of the trench (which defines the width (T1) thereof) need not be substantially uniform, but can be of a reverse-trapezoid shape with the trench width wider at the top and narrower at the bottom, as long as the depth of the trench (F1) is sufficient to expose the ground pad (112) on the mounting surface (S1) of the substrate (110).

The confined trench is disposed in encapsulating member to define at least two package compartments, which are eventually fabricated into individually isolated EMI shielding compartments. In the instant exemplary embodiment, the trench (F1) defines two package compartments (130a) in the encapsulated member (130), with at least one of the compartment (130a) containing at least one electronic element (120). However, it should be noted that, the number of compartments as well as the number of electronic components encapsulated therein shall depend on the particular functional requirements and specific operational needs, and should not be limited to the pictorial illustration provided for the instant exemplary embodiment.

The encapsulating member (130) may comprise module encapsulation adhesive, and is used to provide structural protection to the wires, pads, and leads of the circuitry and prevent electrical shorting. Specifically, the encapsulating member (130) may be made from various pre-impregnated materials (pre-preg), such as glass fiber pre-preg, carbon fiber pre-preg, epoxy resin pre-preg, etc.

The compartment structure (140) is formed by disposing conductive material into the trench (F1). Specifically, conductive material is disposed into the trench (F1) to at least cover the trench surface and cured to form the compartment structure (140). As the trench (F1) is sufficiently deep to expose the ground pad (112) on the mounting surface (112), the conductive material disposed into the trench shall establish contact there-with. Upon curing, a compartment structure (140) that electrically connects the ground pad (112) is formed. The compartment structure (140) comprises at least a lateral-width (as illustrated by the line segment C1 in the overhead view of FIG. 1A) and at least a lateral-length (as illustrated by the line segment C2 in the overhead view of FIG. 1A). Please refer to FIG. 1A, the lateral-width (C1) of the compartment structure (140), which corresponds to the terminal portion (F12) of the trench (F1), is arranged proximal to the peripheral surface (P1) of the encapsulating member (130) yet confined within the boundary defined there-by, while the lateral-length (C2) extends within the abovementioned boundary. Notches (N1) are respectively disposed into the encapsulating member (130) from the peripheral surface (P1) at locations corresponding to the terminal portions of the trench to expose the lateral width (C1) of the compartment structure (140). Moreover, the notch (N1) is preferably disposed in such way to allow exposure of the lateral surface of the compartment structure (140) across the height (thickness) of the encapsulating member (130), i.e. from the top surface to the bottom thereof, so that thorough lateral-isolation can be established upon the deposition of conformal shield (150) (whose detail will be discussed in a later section).

The width of the notch (N1), as illustrated by the width (L2) shown in the overhead view of FIG. 1A, is preferably wider than that of the trench (F1) (which also substantially corresponds to the width of the compartment structure (140)), as illustrated by the width (T1). In the instant exemplary embodiment, the width (T1) of the compartment structure (140) ranges from 60 μm to 180 μm; the width (L2) of the notch (N1) ranges from 80 μm to 200 μm.

The compartment structure (140) is made of electrically conductive material. The material may include metallic material such as copper, aluminum, silver bromide, or the like; it can also be made of conductive polymer material such as polyaniline (Pan), polypyrrole (PYy), polythiophene (PTh), or any suitable combination thereof.

The conformal shield (150) is disposed on the encapsulating member (130) and at least partially covers the peripheral surface (P1). In practice, the conformal shield (150) is preferably disposed on the exposed surface of the encapsulating member (130) to form a surrounding conductive shield around the electronic components to be protected. In some applications, it is desirable to further extend the coverage of the conformal shield (150) from the encapsulating member (130) to at least part of the substrate surface (as illustrated by FIG. 1C, where the coverage of the conformal shield (150) extends from the top surface of the encapsulating surface (130), continuously extending through the peripheral surface (P1) thereof, and finally down to the lateral portion of the substrate (110)). Moreover, the conformal shield (150), which is disposed on the outer surface of the encapsulating member (130) to provide shielding coverage for the electronic components contained therein, establishes physical contact (as well as electrical connection) with the exposed portions of the compartment structure (140) respectively through the top surface of the encapsulating member (i.e., through the top opening of the trench) and the notches (N1) disposed on the lateral/peripheral surface (P1), thereby forming a thorough isolation shield structure around each package compartment (130a).

A fabricating method for providing an electromagnetic interference (EMI) compartment shielding structure in accordance with the instant disclosure will now be discussed with reference made to the pictorial illustrations provided by FIGS. 3A-3G.

Figure 3A:
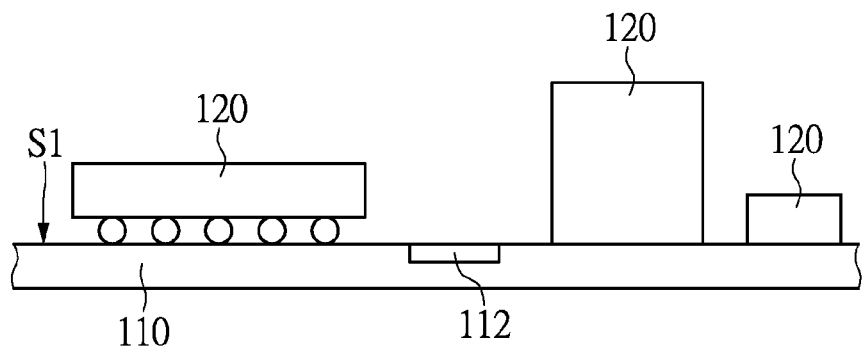
FIGS. 3A-3I respectively show an electronic package utilizing an EMI shielding structure in accordance with the instant disclosure during various steps of fabrication process.

Please refer to FIG. 3A. A substrate (110) having a mounting surface (S1) is provided for mounting at least one electronic element (120). The substrate (110) comprises a ground pad (112) exposedly arranged on the mounting surface (S1). In the instant exemplary embodiment, the substrate (110) is a large size circuit substrate strip/panel that serves as a carrier for a plurality of electronic packages (FIG. 3A only shows a portion thereof that corresponds to one of the electronic packages), which will be subject to singulation into a plurality of individual packages in a later stage. The electronic elements (120) may include active and/or passive components such as transceiver ICs, memory circuits, and other ICs that produce electromagnetic signals with fundamentals/harmonics in radio frequency bands, as well as electronic chips, transistors, diodes, inductors, capacitors, resistors, and switches. As previously mentioned, the number, type, and arrangement of the electronic elements (120) shall depend on particular functional requirement and specific operational needs, and should not be limited to the pictorial illustration provided for the instant exemplary embodiment. Moreover, the interconnection between the electronic element (120) and the substrate (110) may be accomplished through wire bonding, flip chip, and/or any other suitable techniques.

Figure 3B:
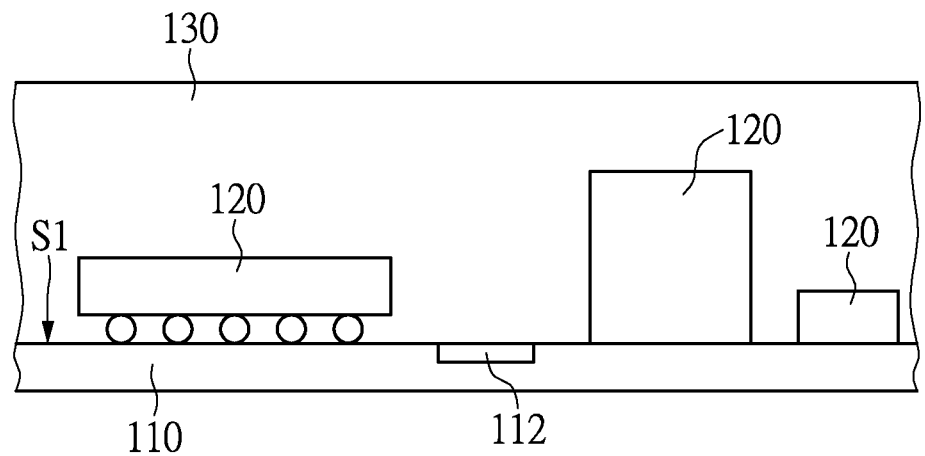

Please refer to FIG. 3B. The encapsulating member (130) is disposed on the substrate (110) to at least partially cover the mounting surface (S1) and encapsulate the electronic elements (120) to be protected. The encapsulating member (130) is disposed to provide structural protection to the wires, pads, and leads of the circuitry on the mounting surface (S1), thus prevent electrical shorting. The encapsulating member (130) may be made from various pre-impregnated materials (pre-preg), such as glass fiber pre-preg, carbon fiber pre-preg, epoxy resin pre-preg, etc. Structurally, the encapsulating member (130) defines at least a peripheral surface (P1).

Figure 3C:
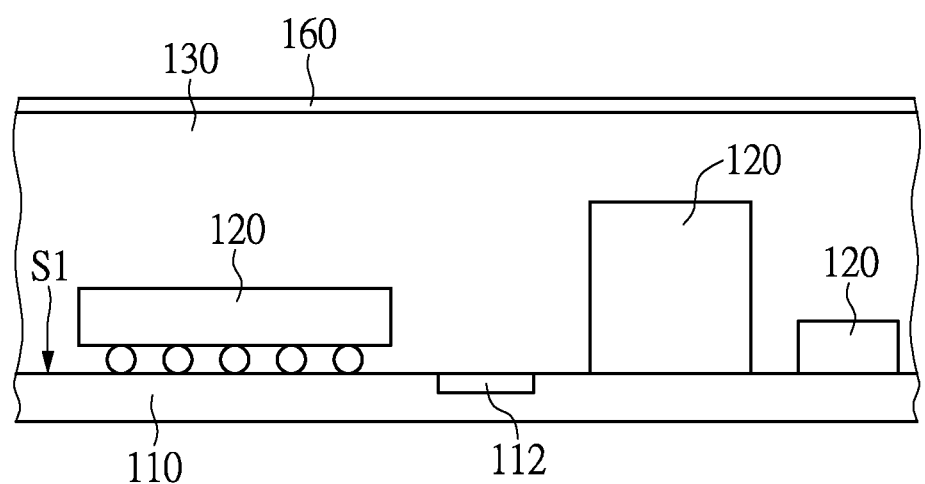

Please refer to FIG. 3C. A confined trench is to be disposed in the encapsulating member (130) to substantially dividing the encapsulating member into at least two regions, thereby defining at least two package compartments (130a) therein. Depending on the method of forming the trench, the deposition of protective mask (160) on the encapsulating member (130) may be desirable. For instance, in the instant exemplary embodiment, laser scribing process is adapted for forming the trench. As laser scribing technique is known for producing a great deal of dust during the material removal process, it is often desirable to form a protective mask (160) on the encapsulating member (130) to prevent/alleviate dust contamination problem. The protective mask (160) may be made from insulating ink coating applied through an ink jet dispenser, or formed by any other suitable materials and methods.

Figure 3D:
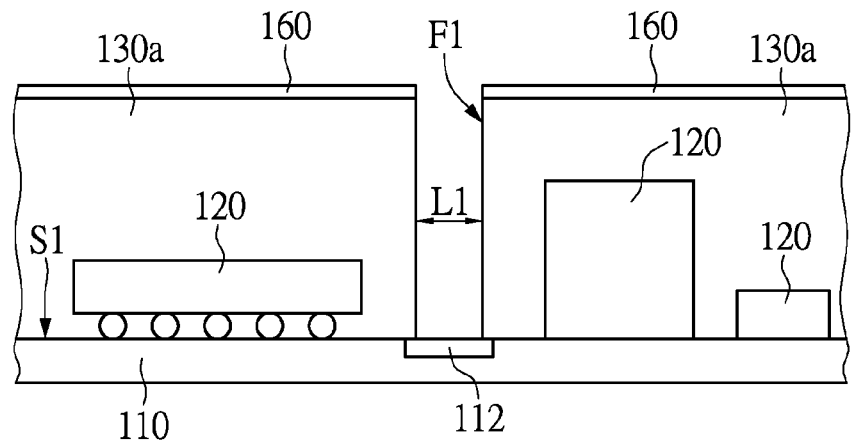

Please refer to FIG. 3D. A confined Trench (F1) is disposed in the encapsulating member (130) to define at least two package compartments (130a) therein (please refer concurrently to the overhead view of FIG. 1A, as the confined trench may not be apparently shown in the cross-sectional view of FIG. 3D). In the instant exemplary embodiment, laser scribing process is performed from the top surface of the encapsulating member (130) toward the substrate (110) to create a desirable trench pattern that substantially divides the encapsulating member (130) into at least two package compartments (130a). Specifically, the trench (F1) is patterned within the encapsulating member (in an overhead view, as shown in FIG. 1A), with the end portions thereof confined within the boundary defined by the peripheral surface (P1), i.e., without compromising the peripheral surface (P1) of the encapsulating member (130). Moreover, in order to (1) allow conductive filling material disposed therein (in a later stage) to establish connection with the ground pad (112) and (2) create a thoroughly isolated compartment structure between the package compartments (130a), the trench (F1) is penetratively formed from the top surface of the encapsulating member (130) to the bottom surface thereof, and is correspondingly patterned/positioned to at least partially reveal/expose the ground pad (112) on the mounting surface (S1) of the substrate (110). In some case, certain segment of the trench (F1) may even have a trench depth that extends beyond the bottom of the encapsulating member (130) into the substrate (110), i.e., forming a shallow groove (figures not shown) on the mounting surface (P1). This may allow the formation of a more deeply-rooted compartment structure (140) between the package compartments (130a), thereby offering even better EMI shielding/isolation performance. Furthermore, as previously mentioned, the overhead pattern, the penetrating angle, and the cross-sectional shape of the trench (F1) may vary according to specific functional considerations or to accommodate different manufacturing requirements. For example, in some embodiments, the trench pattern may comprise segments and bends, (as shown by FIG. 1B); in some cases it can even comprise serrated and/or curvilinear segments. Likewise, the cross-sectional shape of the trench need not be substantially uniform, but can be of a reverse-trapezoid shape with the trench width wider at the top and narrower at the bottom.

Figure 3E:
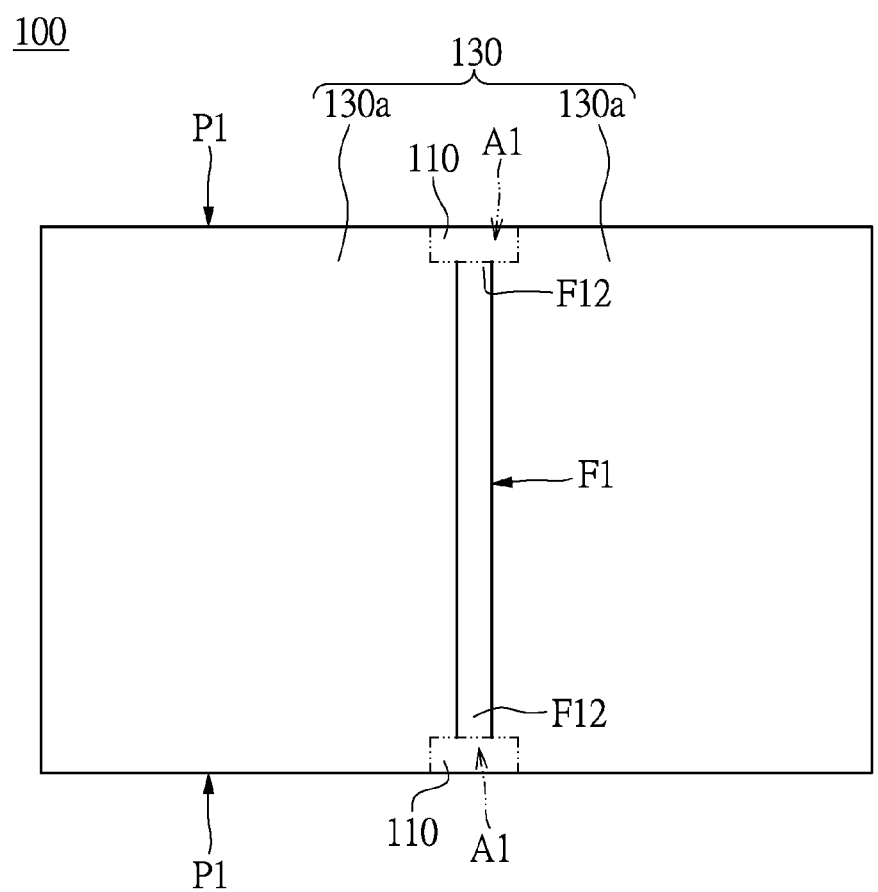

Please refer to FIG. 3E. For the ease of reference, the residual portion (of the encapsulating member) between the peripheral surface (P1) and the terminal portion of the trench (F1) is denoted as "buffer zone" (please refer to the overhead view of FIG. 1A). The buffer zone generally comprises the shortest distance from the peripheral surface of the encapsulating member (130) to the terminal portion of the trench (F1). In some applications, the residual of buffer zone proximate the peripheral surface (P1) is beneficial for retaining conductive filling material during the formation of the compartment structure (140) (this feature will be discussed in more detail in the following paragraph).

Figure 3F:
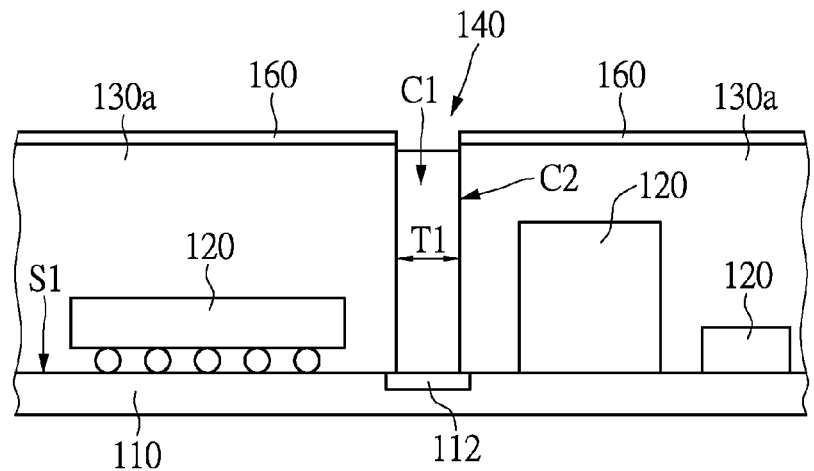

Please refer to FIG. 3F. Conductive material is disposed into the trench (F1) to trench (F1) to form the compartment structure (140). In general, the deposition of conductive material does not have to reach the degree of fully filling the trench (F1); thorough coverage of the trench surface by the conductive material would be sufficient. The deposition of conductive material can be carried out through a variety of different processes/techniques, each requiring different equipment and incurring different costs. By way of example, suitable deposition technique may include electro-plating, electro-less plating, sputter deposition, spray plating, injection, etc. Some of these techniques incur more cost/operational inconvenience than others. For example, electro-less plating technique is known for its ability to produce uniform and durable coating layers of great thinness on non-metallic parts (such as the electrically insulating materials of PCBs), and is particularly suitable for coating irregularly shaped objects (or holes/trenches having great aspect ratio) without undesirable nodular deposits. However, the use of electro-less plating process requires the displacement of the package-substrate from the original fabrication platform into chemical bath for electro-less plating process. This requirement causes operational inconvenience, which translates into less fabrication efficiency and higher production cost. Likewise, while sputter deposition is known for its ability to dispose uniform thin-film on the surface of irregular structures having great aspect ratio, the requirement for a vacuum chamber and other expensive equipment means high over-head costs, which is not always justifiable/acceptable. Spray plating and injection methods, although not the most sophisticated technique among the available options, are relatively accessible method that requires considerably more affordable equipment. Moreover, as mentioned above, the residual material between the peripheral surface (P1) and the terminal portion of the trench (F1) (i.e., the buffer zone) would serve as a retaining wall for retaining the conductive filling material that is being sprayed onto the trench surface in the encapsulating member (130). This will not only enhance the efficiency of the deposition process, but also prevent spilling of the disposed material onto other parts of the substrate/package, causing undesirable contamination. The conductive material disposed into the trench (F1) establishes contact with the ground pad (112) on the mounting surface (S1). Upon curing of the conductive material (through any suitable curing method such as baking-curing), the compartment structure (140), which is in electrical connection with the ground pad (112), has taken shape.

Figure 3G:
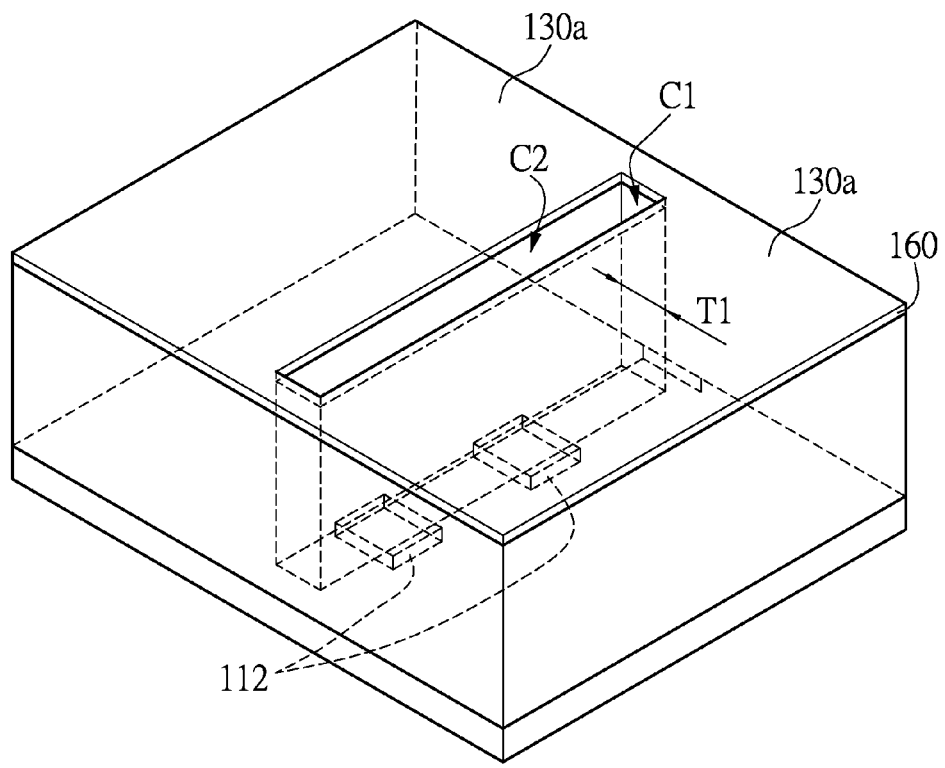

Please refer to FIG. 3G, which is an isotropic view for easier visual presentation. The compartment structure (140) comprises at least a lateral width (C1) and at least a lateral length (C2), as shown in FIG. 3E. Moreover, the width of the compartment structure (140) thus formed substantially corresponds to the width of the trench (T1), which, in this exemplary embodiment, ranges from 60 to 180 μm.

Figure 3H:
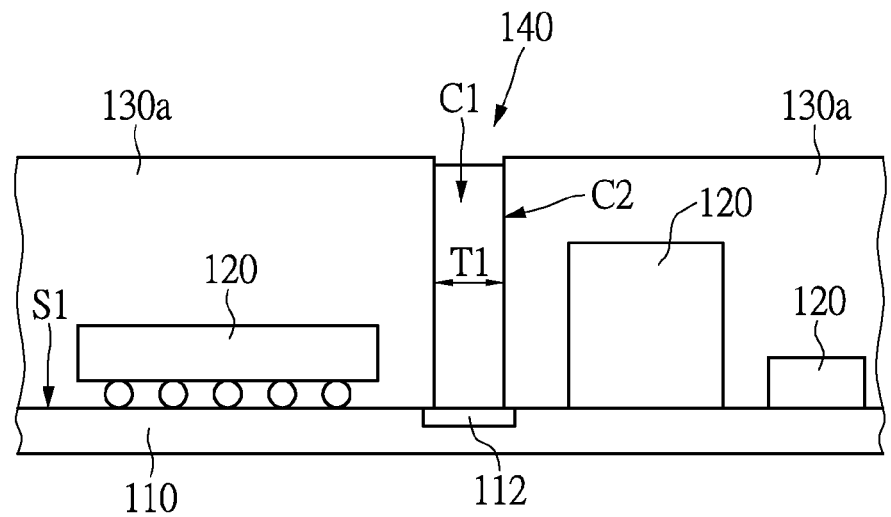

Please refer to FIG. 3H. The protective mask (160) serves the purpose of protecting the package/substrate from the dust generated during the laser scribing process. After the deposition of the compartment structure (140), a mask removal step may be carried out to remove the protective mask (160) from the surface of the encapsulated package, in preparation for the deposition step of a conformal shield (150) that follows.

Figure 3I:
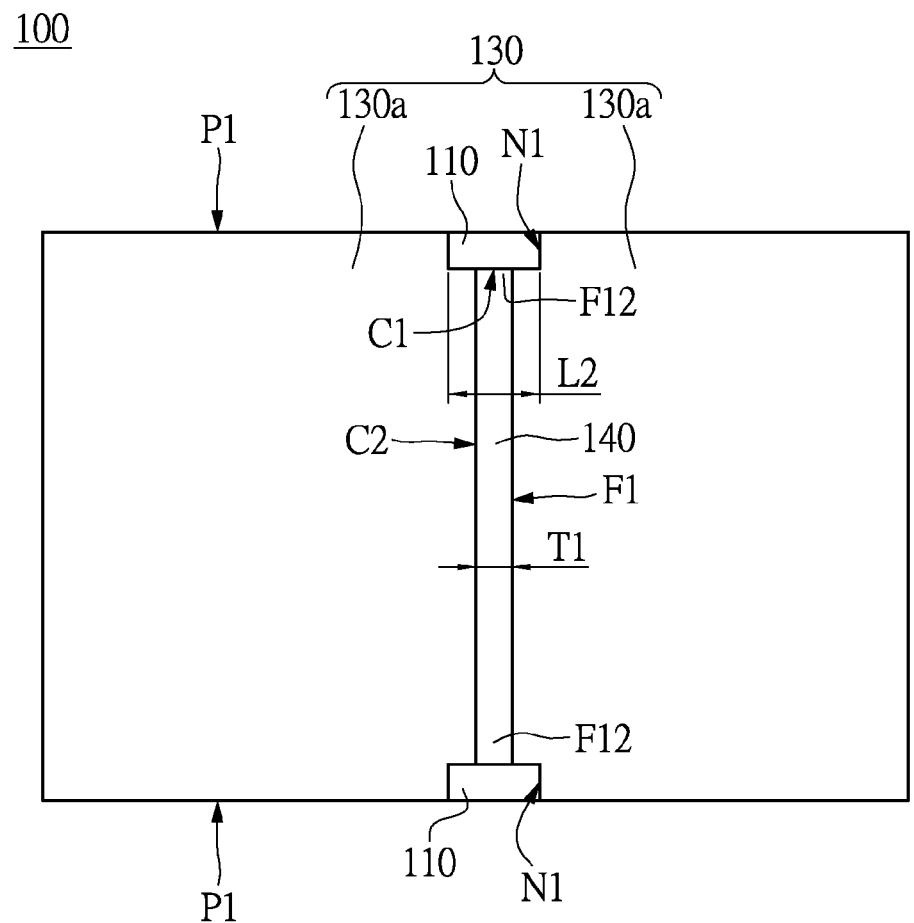

Please refer to FIG. 3I. Notches (N1) are respectively disposed into the encapsulating member (130) from the peripheral surface (P1) (by selective removal of the encapsulating material in the buffer zone) at locations corresponding to the terminal portions (F12) of the trench (F1) to at least partially expose the lateral width (C1) of the compartment structure (140). More specifically, the notch (N1) is preferably disposed in such way to allow exposure of the lateral surface of the compartment structure (140) across the height (thickness) of the encapsulating member (130), i.e. from the top surface to the bottom thereof, so that a thorough lateral-isolating structure can be formed upon the deposition of the conformal shield (150) in a following step. Moreover, to enhance consistency and reliability in exposing the lateral surface of the compartment structure (140) across the thickness of the encapsulated package, the width of the notch (L2) is preferably wider than (or at least substantially equal to) the width of the trench (T1). A wider notch width (L2) (relative to the trench width (T1)) allows more secure and thorough connection to be established between the compartment structure (140) and the later disposed conformal shield (150) through the economical spray plating process, thereby facilitating the formation of a high performance EMI isolation structure. In the instant exemplary embodiment, the notch width (L2) ranges from 80 to 200 μm. Furthermore, since the notch (N1) is disposed on the peripheral surface (P1) at locations corresponding to the terminal portions (F12) of the trench (i.e. the end portion of the compartment structure (140)), the number of notches (N1) preferably required is generally determined by the number of end portions (F12) a particular trench pattern comprises.

It is to be noted that, depending on applications, a singulation process may be carried out to form individual electronic packages after the formation of the compartment structure (140) and prior to the deposition of the conformal shield (150).

Please refer back to FIG. 1C, which illustrates a cross-sectional view of a package-integrated EMI compartment shielding structure in accordance with the instant disclosure in substantial completion. Specifically, a conformal shield (150) is disposed on the encapsulating member (130), preferably through the cost-effective spray plating technique. The conformal shield (150) is preferably disposed on the exposed surface of the encapsulating member (130) to form a surrounding conductive shield around the electronic components to be protected. In some applications, it is desirable to further extend the coverage of the conformal shield (150) from the peripheral surface (P1) of the encapsulating member (130) to at least part of the substrate surface (as illustrated in FIG. 1C). Moreover, the conformal shield (150), which is disposed on the outer surface of the encapsulating member (130) to provide shielding coverage for the electronic components contained therein, establishes physical contact (as well as electrical connection) with the exposed portions of the compartment structure (140) respectively through the top surface of the encapsulating member (130) and the notches (N1) disposed on the lateral/peripheral surface (P1) thereof, thereby forming a thorough isolation shield structure around each package compartment (130a).

While the invention has been disclosed with respect to a limited number of embodiments, numerous modifications and variations will be appreciated by those skilled in the art. It is intended, therefore, that the following claims cover all such modifications and variations that may fall within the true spirit and scope of the invention.

What is claimed is:

1. An electronic package module having integrated EMI compartment shielding structure, comprising:
    a substrate having mounting surface, comprising a ground pad exposedly arranged thereon;
    at least one electronic element disposed on the mounting surface;
    an encapsulating member disposed on the mounting surface, covering the ground pad and encapsulating at least one of the electronic element, the encapsulating member having at least one peripheral surface,
        wherein a trench is disposed in the encapsulating member to define at least two package compartments, the trench at least partially exposes the ground pad,
        wherein the terminal portions of the trench is arranged within the encapsulating member proximal to yet without compromising the peripheral surface thereof;
        wherein at least one notch is disposed into the encapsulating member from the peripheral surface thereof corresponding to the location of the terminal portions of the trench;
    a compartment structure disposed in the trench covering the trench surface,
        wherein the compartment structure electrically connects the ground pad,
        wherein the notch exposes the lateral surface of the compartment structure across the thickness of the encapsulating member; and
    a conformal shield disposed on the encapsulating member, wherein the conformal shield electrically connects the compartment structure through the notch.

2. The electronic package module of claim 1, wherein the notch has a width wider than that of the trench.

3. The electronic package module of claim 1, wherein the width of the compartment structure ranges from 60 to 180 μm.

4. The electronic package module of claim 1, wherein the width of the notch ranges from 80 to 200 μm.

5. A method of providing electromagnetic interference (EMI) compartment shielding for electronic elements, comprising:
    providing an electronic element mounting surface having a ground pad exposedly arranged thereon for mounting at least one electronic element;
    disposing an encapsulating member on the mounting surface covering the ground pad and encapsulating at least one electronic element mounted thereon, the encapsulating member having at least one peripheral surface;
    disposing a trench pattern in the encapsulating member to define at least two package compartments therein,
        wherein the depth of the trench is sufficient to at least partially expose the ground pad,
        wherein the terminal portions of the trench is arranged within the encapsulating member proximal yet without compromising the peripheral surface;
    disposing conductive material into the trench to at least cover the trench surface for forming a compartment structure,
        wherein the compartment structure electrically connects the ground pad;
    disposing notches respectively into the encapsulating member from the peripheral surface thereof corresponding to the location of the terminal portions of the trench to expose the compartment structure across the thickness of the encapsulating member; and
    disposing conformal shielding on the encapsulating member and establishing connection thereof with the compartment structure through the notches.

6. The method of claim 5, wherein the notch has a width wider than that of the trench.

7. The method of claim 5, wherein the disposing of conductive material for forming compartment structure utilizes spraying coating process.

8. The method of claim 5, further comprising: defining a buffer zone between the peripheral surface of the encapsulating member and a terminal portion of the trench pattern.

9. The method of claim 5, wherein the width of the compartment structure ranges from 60 to 180 μm.

10. The method of claim 5, wherein the width of the notch ranges from 80 to 200 μm.

11. The method of claim 5, wherein the trench is formed by laser scribing.

12. The method of claim 5, further comprising: disposing a protective mask on the encapsulating member prior to the deposition of the trench pattern.

13. The method of claim 12, further comprising: removing the protective mask after the deposition of the compartment structure.

14. The method of claim 5, further comprising: performing a singulation process prior to the deposition of the conformal shield.

* * * * *